Jan. 11, 1966 R. C. McGIBBON 3,228,811

QUANTUM MECHANICAL TUNNELING SEMICONDUCTOR DEVICE

Filed Nov. 3, 1960

INVENTOR
RALPH C. Mc GIBBON

BY Alvin J. Riddles
ATTORNEY 3,228,811

QUANTUM MECHANICAL TUNNELING SEMICONDUCTOR DEVICE

Ralph C. McGibbon, Poughkeepsie, N.Y., assignor to International Business Machines Corporation, New York, N.Y., a corporation of New York Filed Nov. 3, 1960, Ser. No. 67,061
5 Claims. (Cl. 148—33)

This invention relates to alloy connections in semiconductor devices; and, in particular, to improved alloy connections in quantum mechanical tunneling devices.

The phenomenon of quantum mechanical tunneling in "p-n" junctions in semiconductor material has been described by Dr. Leo Esaki in the Physical Review, vol. 109, January 1958, pages 603 and 604 and a two terminal device well-known in the art employing this phenomenon has come to be known as the "Esaki" or "tunnel" diode.

A quantum mechanical tunneling type device may be described as one having a short circuit stable negative resistance in its output characteristic at low voltages and which is effectively insensitive to both temperature and radiation effects. Semiconductor devices involving the phenomenon of quantum mechanical tunneling require certain physical criteria in their structure that are different from conventional semiconductor "p-n" junctions. These criteria are that the semiconductor material on each side of the junction be extremely heavily doped and that the width of the junction, that is, the distance in the semiconductor material from the highly doped region of one conductivity type through intrinsic at the junction and back to the highly doped region of the opposite conductivity type region be very narrow. Quantum mechanical tunneling devices have exhibited a wide range of performance characteristics dependent upon the semiconductor materials from which they have been made. Some of the better semiconductor materials from which these devices may be made have been the class of binary inter-metallic compound semiconductor materials of which the material indium-antimonide is a member. However, a problem has existed in the art in that it has been difficult to fabricate very high doped alloy connections in these inter-metallic compounds due to problems with the compatibility of the various physical characteristics of the doping elements and of the inter-metallic compound in introducing the necessary extremely high concentration of conductivity type determining impurities, in such a small dimension as the width of the junction requires.

What has been discovered is that a superior quantum mechanical tunneling semiconductor device may be fabricated from a bulk portion of "n" conductivity type indium-antimonide into which an alloy connection of pure indium is made.

It is a primary object of this invention to provide an improved quantum mechanical tunneling device.

It is another object of this invention to provide an improved alloy connection in a semiconductor device.

It is another object of this invention to provide an indium-antimonide quantum mechanical tunneling alloy semi-conductor connection.

It is another object of this invention to provide an improved "p" conductivity type doping agent for indium-antimonide.

The foregoing and other objects, features and advantages of the invention will be apparent from the following more particular description of a preferred embodiment of the invention, as illustrated in the accompanying drawings.

Figures 1, 2, 3:
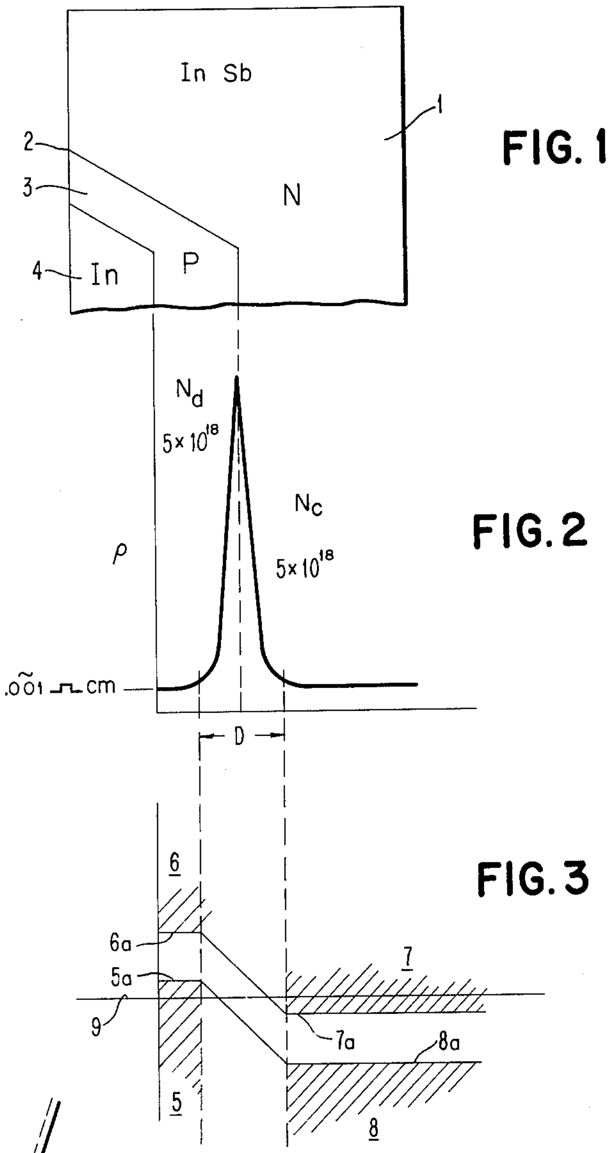
FIG. 1 is a schematic view of an alloy semiconductor connection in accordance with the invention.
FIG. 2 is a dimensionally correlated resistivity plot showing some of the criteria of a quantum mechanical tunneling junction.
FIG. 3 is an energy level diagram dimensionally correlated to show other criteria of the quantum mechanical tunneling junction.

Referring to FIG. 1, a sketch is shown of a quantum mechanical tunneling type alloy junction made in accordance with the invention. The junction is made up of a bulk region 1 of indium-antimonide containing "n" conductivity type determining impurities, for example, selenium, in a concentration such that the semiconductor material is degenerate, that is, the impurity concentration is sufficiently great that the conductivity or the semiconductor material varies inversely with temperature. The semiconductor device of FIG. 1 has an abrupt "p-n" junction 2 between a recrystallized region 3 of "p" conductivity type indium-antimonide and the "n" conductivity type indium-antimonide body 1. The recrystallized region 3 is formed as a result of alloying a quantity of indium 4 into the indium-antimonide body 1. The indium 4 also serves as an ohmic contact to the region 3. It has been found that in alloying into indium-antimonide with substantially pure indium, a sufficient quantity of the indium from the region 4 is included in the recrystallized region 3 and operates to impart "p" conductivity type to the recrystallized region 3 in a concentration sufficiently high that degenerate semiconductor material is approached in a sufficiently short physical distance to impart quantum mechanical tunneling properties to the "p-n" junction produced.

Referring next to FIG. 2, a dimensionally correlated resistivity plot of the device of FIG. 1 is shown wherein resistivity is plotted as the ordinate and distance across the junction 2 of FIG. 1 is plotted as the abscissa. The resistivity across the junction 2 varies from a constant value approaching degeneracy in the region 3 through intrinsic at the junction 2 and back to the constant value approaching degeneracy in the region 1. The resistivity value for degenerate indium-antimonide is approximately 0.001 ohm cm. and is produced by the introduction of conductivity type determining impurities into the material in a concentration on the order of $5 \times 10^{18}$ atoms per cc., as is illustrated in FIG. 2.

Since quantum mechanical tunneling is based upon a probability that certain carriers in the semiconductor material contain sufficient energy and this probability is a steep exponential; it has been found that the distance in the semiconductor material across the junction, from the point in the "p" region at which the concentration of conductivity type determining impurities departs from degeneracy and rises to intrinsic at which point the concentrations of donor and acceptor semiconductor impurities are in balance and then returns to degeneracy in the "n" conductivity type region must be a very small physical dimension to have a useful probability. This distance is labelled D in FIG. 2 and for the material indium-antimonide this dimension is in the vicinity of 100 Angstrom units.

Referring next to FIG. 3, an energy level diagram is provided wherein the "p" conductivity type region has a valence band 5 with an upper edge *5a* and a conduction band 6 having a lower edge *6a*. Similarly, the "n" conductivity type region is equipped with a conduction band 7 having a lower edge *7a* and a valence band 8 having an upper edge *8a*. The effects of the degenerate doping of the semiconductor materials are such as to cause the valence band edge *7a* of the "n" conductivity type material to overlap the conduction band edge *5a* of the "p" conductivity type material so that the Fermi level 9 passes from the valence band of the one conductivity type material to the conduction band of the other and the transition region is within the width D as shown dimensionally correlated with FIG. 2 so that a carrier having sufficient energy can tunnel directly from the valence band of the "p" type semiconductor material to the conduction band of the "n" conductivity type semiconductor material.

Figure 4:
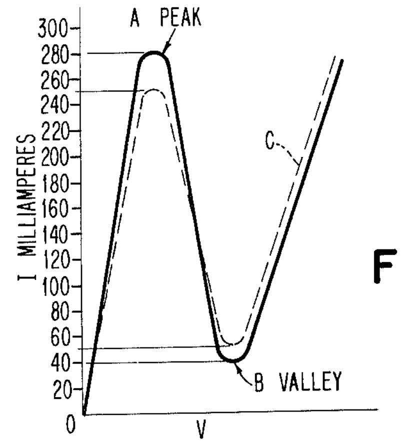
FIG. 4 is an illustrative current-voltage output characteristic of a quantum mechanical tunneling type "p-n" junction in a semiconductor device.

Referring next to FIG. 4, a typical output characteristic of a semiconductor "p-n" junction having quantum mechanical tunneling type performance is shown wherein, referring to both FIGS. 4 and 3, with an initial application of voltage there is a sharp increase in current to a first turn-over point, labelled A in FIG. 4. The first turn-over point A is known in the art as the "peak" value of the output current and is governed by the saturation of carriers tunneling from the valence band on one side of the "p-n" junction to the conduction band on the other side of the "p-n" junction in the semiconductor material. Once this saturation takes place, further increases in voltage operate to change the relative positions of the bands in FIG. 3, this reduces the effect of the tunneling and in FIG. 4 reduces the current as the voltage increases until a second turn-over point B is reached. At this point, the voltage has reached a value sufficient to provide a field capable of overcoming in FIG 3 the forbidden region of the semiconductor material. This turn-over point is known in the art as the "valley" and after this turn-over point, further increases in voltage result in linear increases in current. A figure of merit of quantum mechanical tunneling type semiconductor junction devices is the ratio of peak-to-valley in the output characteristic, and it has been found that indium will provide sufficiently heavily doping in indium-antimonide semiconductor material not only to produce a quantum mechanical tunneling type junction but also to give a higher peak-to-valley ratio in indium-antimonide than has been seen heretofore in the art using a conventional doping agent, such as selenium or cadmium.

An example of the difference of peak-to-valley ratio may be observed in connection with FIG. 4 wherein a dotted line labelled C has been drawn to illustrate the advantages of the invention. The dotted line C is an example of the peak-to-valley ratio of an indium-antimonide quantum mechanical tunneling junction using the element cadmium as a doping agent; whereas, the solid line is an example of the quantum mechanical tunneling type junction of the invention using indium in indium-antimonide.

In order to aid one skilled in the art in practicing the invention and to provide a starting place for one skilled in the art in a complicated technology, the following specific values of a workable embodiment are provided. However, it should be noted that in the light of the above description many such sets of specific values may be provided so that no limitation should be construed by these values.

Referring to FIG. 1, a body of indium-antimonide containing selenium in a concentration of approximately $10^{19}$ atoms per cc. is brought into contact with a body containing indium, essentially pure to a quality greater than 99%, and heated to approximately 400° C. for five minutes in order to form an alloy connection involving region 3 and junction 2 of FIG. 1. The output characteristic of the resulting semiconductor structure giving a peak-to-valley ratio, as illustrated in FIG. 4, of 7 as compared with a peak-to-valley ratio of about 5 for a similar device wherein the doping agent was cadmium.

What has been described is an improved doping agent for the semiconductor material indium-antimonide and an improved indium-antimonide quantum mechanical tunneling semiconductor structure.

While the invention has been particularly shown and described with reference to a preferred embodiment thereof, it will be understood by those skilled in the art that the foregoing and other changes in form and details may be made from the spirit and scope of the invention.

What is claimed is:

1. An "n" conductivity type improved quantum mechanical tunneling alloy connection to an indium-antimonide semiconductor body containing an impurity density in excess of $10^{18}$ atoms per cc. comprising: a recrystallized region of indium-antimonide forming a "p-n" junction with said semiconductor body, having a width on the order of 100 Angstrom units, containing said recrystallized region indium in a concentration greater than $5\times10^{18}$ atoms per cc. and a region of indium ohmically connected to said recrystallized region.

2. An improved quantum mechanical tunneling semiconductor device comprising: a body of "n" conductivity type indium-antimonide semiconductor material containing impurities to a density at least $10^{18}$ atoms per cc., a recrystallized region of said indium-antimonide semiconductor material, and forming a "p-n" junction in said body of indium-antimonide semiconductor material having a width on the order of 100 Angstrom units said body of indium-antimonide having a concentration of a donor conductivity type determining impurity in a concentration in excess of $5\times10^{18}$ atoms per cc., said recrystallized region having a concentration of indium as an acceptor conductivity type determining impurity in a concentration in excess of $5\times10^{18}$ atoms per cc. and an ohmic connection to said recrystallized region of indium.

3. An improved quantum mechanical tunneling semiconductor device comprising: a body of degenerate "n" conductivity type indium-antimonide having an alloy rectifying connection of pure indium forming a recrystallized region of degenerate "p" conductivity type indium-antimonide and forming a "p-n" junction with said body of "n" conductivity type having a width on the order of 100 Angstrom units.

4. An improved quantum mechanical tunneling semiconductor device comprising: a body of indium-antimonide containing at least $5\times10^{18}$ atoms per cc. of selenium, a recrystallized region of indium-antimonide containing therein at least $5\times10^{18}$ atoms per cc. of indium forming a 100 Angstrom unit thickness "p-n" junction with said indium-antimonide body and a region of pure indium forming an ohmic contact with said recrystallized region.

5. The method of making a quantum mechanical tunneling type alloy semiconductor device comprising the steps of: placing a quantity of pure indium in contact with a surface of a crystal of "n" conductivity type indium-antimonide containing in excess of $10^{18}$ impurity atoms per cc., heating the combination of said indium and said indium-antimonide at 400° C. until said indium fuses into said indium-antimonide for five minutes and cooling the combination of said indium and said indium-antimonide.

References Cited by the Examiner

UNITED STATES PATENTS

| | | | |
|---|---|---|---|
| 2,847,335 | 8/1958 | Gremmelmaier et al. | 148—1.5 |
| 2,979,428 | 4/1961 | Jenny et al. | 148—33 |
| 3,033,714 | 5/1962 | Ezaki et al. | 148—33 |
| 3,109,758 | 11/1963 | Batdorf et al. | 148—33.1 |

OTHER REFERENCES

Hansen: Constitution of Binary Alloys, 2nd edition, McGraw-Hill Book Co., New York, relied on page 859.

Journal of Applied Physics, vol. 31, page 613 Batdorf, Dacey, Wallace and Walsh, 1960.

DAVID L. RECK, *Primary Examiner.*

RAY K. WINDHAM, WINSTON A. DOUGLAS, *Examiners.*